United States Patent
Maebashi et al.

(10) Patent No.: US 9,699,919 B2
(45) Date of Patent: Jul. 4, 2017

(54) BUS BAR PLATE, ELECTRONIC COMPONENT UNIT, AND WIRE HARNESS

(71) Applicant: Yazaki Corporation, Tokyo (JP)

(72) Inventors: Akemi Maebashi, Shizuoka (JP); Pharima Akanitsuk, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/041,104

(22) Filed: Feb. 11, 2016

(65) Prior Publication Data

US 2016/0242290 A1  Aug. 18, 2016

(30) Foreign Application Priority Data

Feb. 12, 2015  (JP) ................. 2015-025818

(51) Int. Cl.
*H05K 1/14* (2006.01)
*H05K 3/34* (2006.01)

(52) U.S. Cl.
CPC . *H05K 3/3447* (2013.01); *H05K 2201/09818* (2013.01); *H05K 2201/09827* (2013.01); *H05K 2201/09836* (2013.01); *H05K 2201/09845* (2013.01); *H05K 2201/10272* (2013.01)

(58) Field of Classification Search
CPC ....... H05K 3/3447; H05K 2201/10272; H05K 2201/09845; H05K 2201/09818; H05K 2201/09827; H05K 2201/09836
USPC .......................... 361/743; 174/261, 262, 361
See application file for complete search history.

(56) References Cited

U.S. PATENT DOCUMENTS

| 3,838,203 A | * | 9/1974 | Brandlein | H01R 4/027 174/263 |
| 6,372,998 B1 | * | 4/2002 | Suzuki | H01R 43/0256 174/258 |
| 2002/0187689 A1 | * | 12/2002 | Suetsugu | H05K 1/116 439/874 |
| 2002/0195271 A1 | * | 12/2002 | Gailus | H01R 12/523 174/262 |

(Continued)

FOREIGN PATENT DOCUMENTS

| JP | 2004120837 A | 4/2004 |
| JP | 200988573 A | 4/2009 |

(Continued)

OTHER PUBLICATIONS

Communication dated Feb. 21, 2017, from the Japanese Patent Office in counterpart application No. 2015-025818.

*Primary Examiner* — James Wu
(74) *Attorney, Agent, or Firm* — Sughrue Mion, PLLC

(57) ABSTRACT

An electronic component unit and a wire harness are provided with a bus bar plate. The bus bar plate is provided with a metallic bus bar that is built in a resin material, and including a through-hole in which a terminal of a relay mounted on a mounting surface is soldered. The through-hole is provided with a bus bar through-hole which penetrates the bus bar, and a resin material through-hole which penetrates the resin material and is formed to be larger than the bus bar through-hole to expose the surface of the bus bar. When an inner diameter of the bus bar through-hole is defined as r and an inner diameter of the resin material through-hole is defined as R, $1.5r \leq R$ is satisfied.

7 Claims, 6 Drawing Sheets

(56) References Cited

U.S. PATENT DOCUMENTS

2013/0250489 A1* 9/2013 Toda ..................... H02B 1/20
361/648

FOREIGN PATENT DOCUMENTS

JP      2011159868 A * 8/2011
JP      2013-198347 A   9/2013

* cited by examiner

FIG.9

| | OCCURRENCE SITUATION OF VOID |
|---|---|
| COMPARATIVE EXAMPLE 1 | YES |
| EXAMPLE 1 | NONE |
| EXAMPLE 2 | NONE |
| EXAMPLE 3 | NONE |

FIG.10

| | OCCURRENCE SITUATION OF LEAKAGE CURRENT |
|---|---|
| EXAMPLE 1 | NONE |
| EXAMPLE 2 | NONE |
| EXAMPLE 3 | NONE |
| COMPARATIVE EXAMPLE 2 | YES |

BUS BAR PLATE, ELECTRONIC COMPONENT UNIT, AND WIRE HARNESS

CROSS-REFERENCE TO RELATED APPLICATION(S)

The present application claims priority to and incorporates by reference the entire contents of Japanese Patent Application No. 2015-025818 filed in Japan on Feb. 12, 2015.

BACKGROUND OF THE INVENTION

1. Field of the Invention

The present invention relates to a bus bar plate, an electronic component unit, and a wire harness.

2. Description of the Related Art

As a conventional electronic component unit mounted on a vehicle such as an automobile, for example, Japanese Patent Application Laid-open No. 2013-198347 discloses an electronic component module which has an electronic component substrate in which a plurality of bus bars is attached to an insulating plate and a plurality of electronic components is electrically connected to the plurality of bus bars, and a case that houses the electronic component substrate, and in which external terminal connecting units disposed on each bus bar are collected to form a connector connecting unit. In the electronic component module, since the connector connecting unit is disposed between the plurality of electronic components, the size reduction of the unit is attained.

Incidentally, the electronic component unit described in Japanese Patent Application Laid-open No. 2013-198347, for example, is provided with a through-hole to solder electronic component terminals to an electronic component substrate (a plate) to mount the electronic components. Further, in recent years, from the consideration to the environment, a so-called lead-free solder not containing lead has been used as a solder. Since the lead-free solder, for example, is harder than a eutectic solder containing lead, there is room for further improvement in terms of quality improvement at the time of mounting the electronic component as the lead-free solder is easily peeled off from the through-hole.

SUMMARY OF THE INVENTION

The present invention has been made in view of the above circumstances, and is aimed at providing a bus bar plate, an electronic component unit and a wire harness capable of improving the quality at the time of mounting the electronic component.

In order to achieve the above mentioned object, a bus bar plate according to one aspect of the present invention includes a metallic bus bar that is built in a resin material and including a through-hole in which terminals of an electronic component mounted on a mounting surface are soldered. Herein, the through-hole is provided with a bus bar through-hole which penetrates the bus bar, and a resin material through-hole which penetrates the resin material and is formed to be larger than the bus bar through-hole to expose the surface of the bus bar. When an inner diameter of the bus bar through-hole is defined as r and an inner diameter of the resin material through-hole is defined as R, $1.5r \leq R$ is satisfied.

Further, in the bus bar plate according to another aspect of the present invention, when the inner diameter of the bus bar through-hole is defined as r and the inner diameter of the resin material through-hole is defined as R, $R \leq 3.25r$ is satisfied.

Further, in the bus bar plate according to still another aspect of the present invention, when the inner diameter of the bus bar through-hole is defined as r and the inner diameter of the resin material through-hole is defined as R, $1.83r = R$ is satisfied.

Further, in the bus bar plate according to still another aspect of the present invention, the inner diameter of the resin material through-hole closer to the mounting surface than the bus bar through-hole is gradually enlarged, as the resin material through-hole approaches the mounting surface.

In order to achieve the above mentioned object, an electronic component unit according to one aspect of the present invention includes a bus bar plate provided with a metallic bus bar that is built in a resin material and including a through-hole in which terminals of an electronic component mounted on a mounting surface are soldered; and a housing in which the bus bar plate is internally assembled. Herein, the through-hole is provided with a bus bar through-hole which penetrates the bus bar, and a resin material through-hole which penetrates the resin material and is formed to be larger than the bus bar through-hole to expose the surface of the bus bar. When an inner diameter of the bus bar through-hole is defined as r and an inner diameter of the resin material through-hole is defined as R, $1.5r \leq R$ is satisfied.

In order to achieve the above mentioned object, a wire harness according to one aspect of the present invention includes an electronic component unit equipped with a bus bar plate provided with a metallic bus bar that is built in a resin material and including a through-hole in which terminals of an electronic component mounted on a mounting surface are soldered, and a housing in which the bus bar plate is internally assembled; and an electric wire electrically connected to the electronic component unit. Herein, the through-hole is provided with a bus bar through-hole which penetrates the bus bar, and a resin material through-hole which penetrates the resin material and is formed to be larger than the bus bar through-hole to expose the surface of the bus bar. When an inner diameter of the bus bar through-hole is defined as r and an inner diameter of the resin material through-hole is defined as R, $1.5r \leq R$ is satisfied.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 9 is a diagram illustrating an occurrence situation of voids in the example and the comparative example; and FIG. 10 is a diagram illustrating an occurrence situation of a leakage current in the example and the comparative example.

DETAILED DESCRIPTION OF THE PREFERRED EMBODIMENTS

Hereinafter, an embodiment according to the present invention will be described below in detail with reference to the drawings. The present invention is not limited to the embodiment. Further, constituent elements in the embodiment include elements easily replaceable by those skilled in the art or substantially identical elements.

Embodiment

Figure 1:
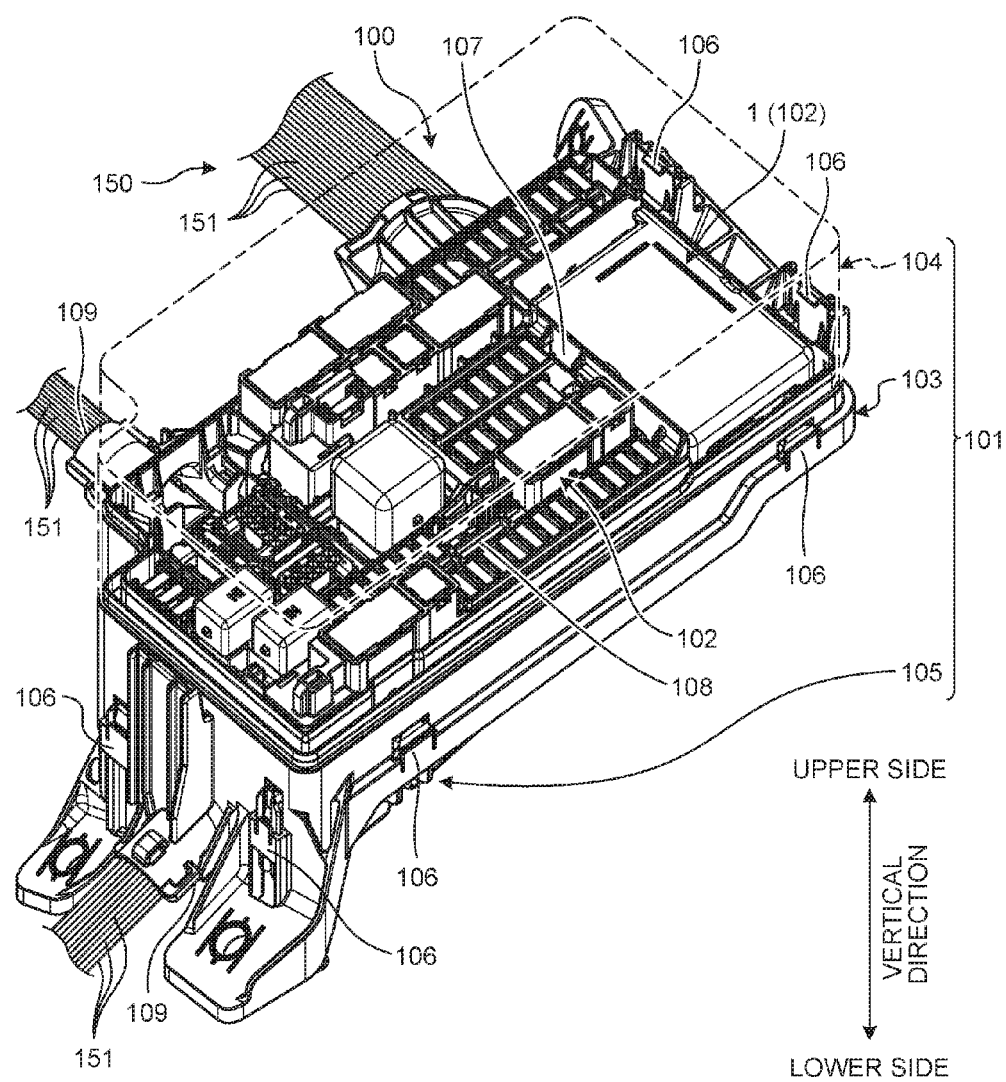
FIG. 1 is a perspective view illustrating a schematic configuration of an electric connection box and a wire harness to which an electronic component unit according to an embodiment is applied.
Figure 2:
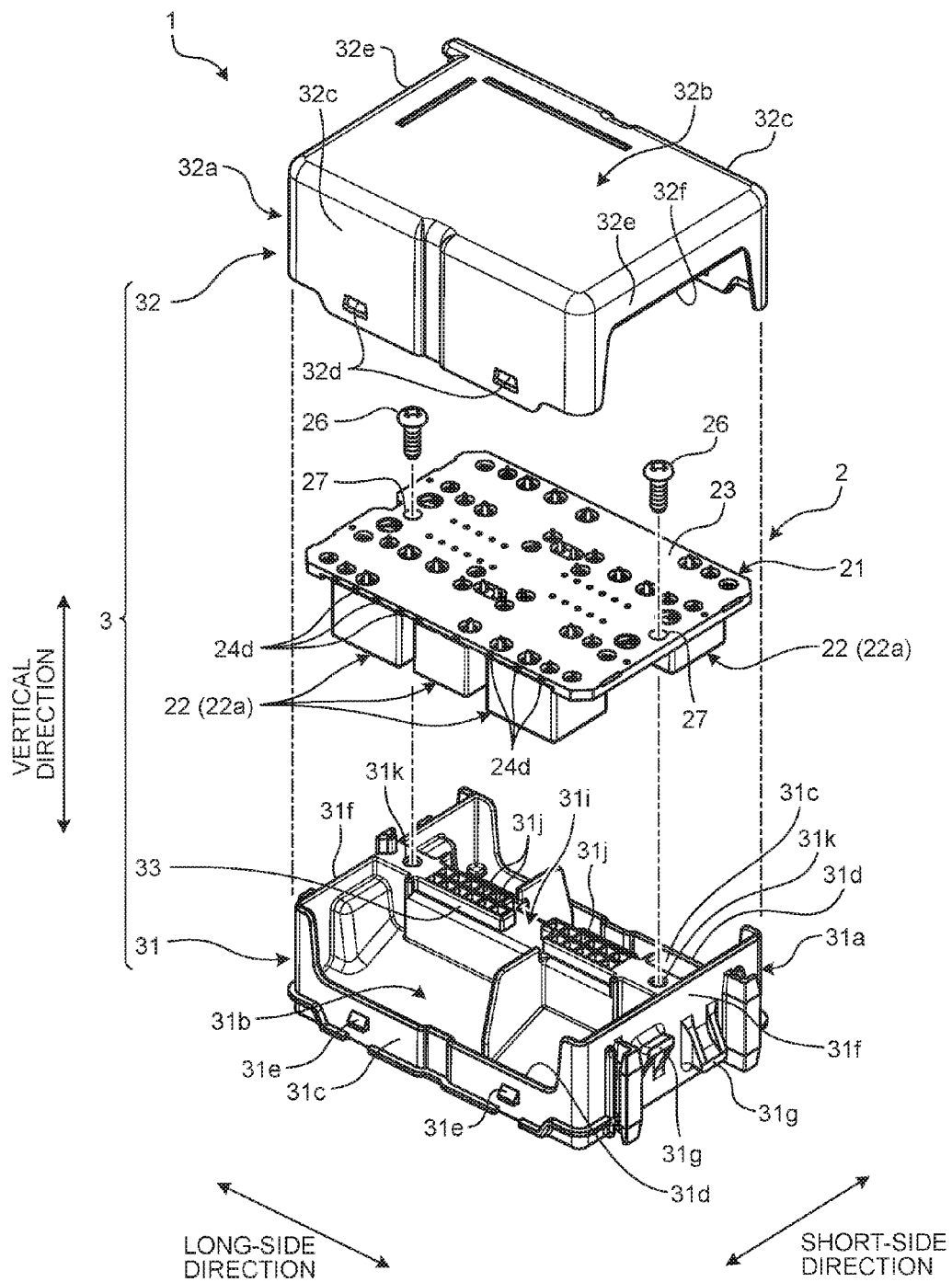
FIG. 2 is an exploded perspective view illustrating a schematic configuration of the electronic component unit according to the embodiment.
Figure 3:
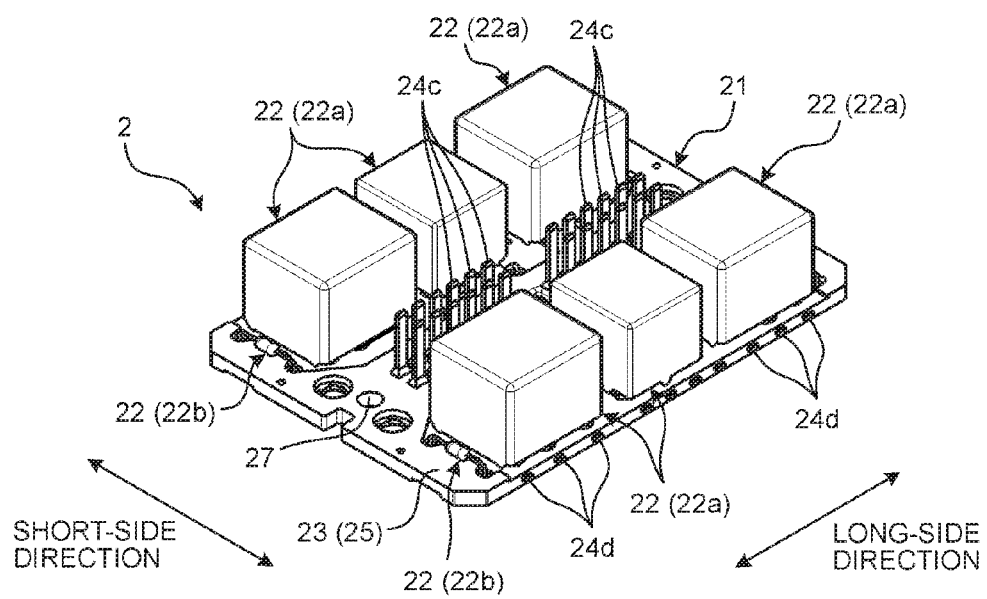
FIG. 3 is a perspective view illustrating a schematic configuration of a bus bar plate of the electronic component unit according to the embodiment.
Figure 4:
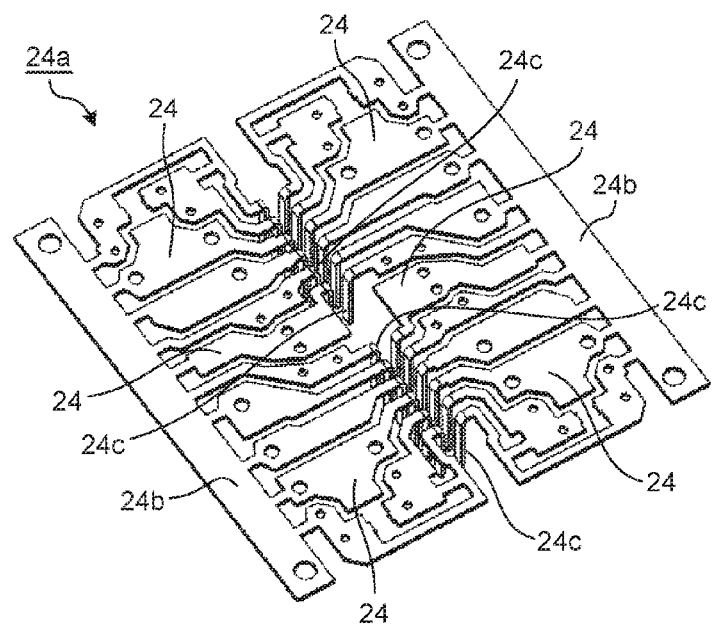
FIG. 4 is a perspective view illustrating a bus bar of the electronic component unit according to the embodiment.
Figure 5:
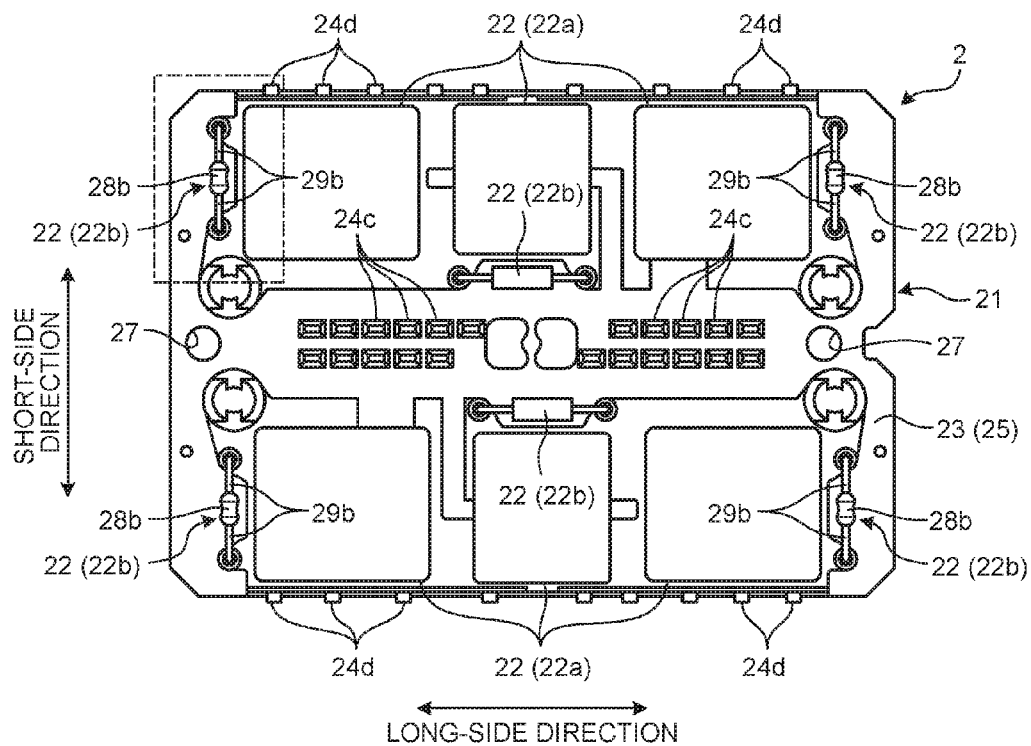
FIG. 5 is a plan view illustrating a schematic configuration of the bus bar plate of the electronic component unit according to the embodiment.
Figure 6:
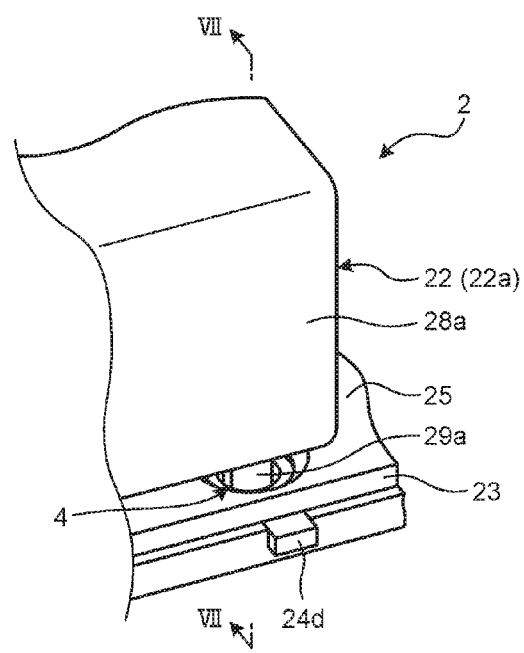
FIG. 6 is an enlarged perspective view illustrating a connection fixing unit of a relay terminal of the bus bar plate of the electronic component unit according to the embodiment.
Figure 7:
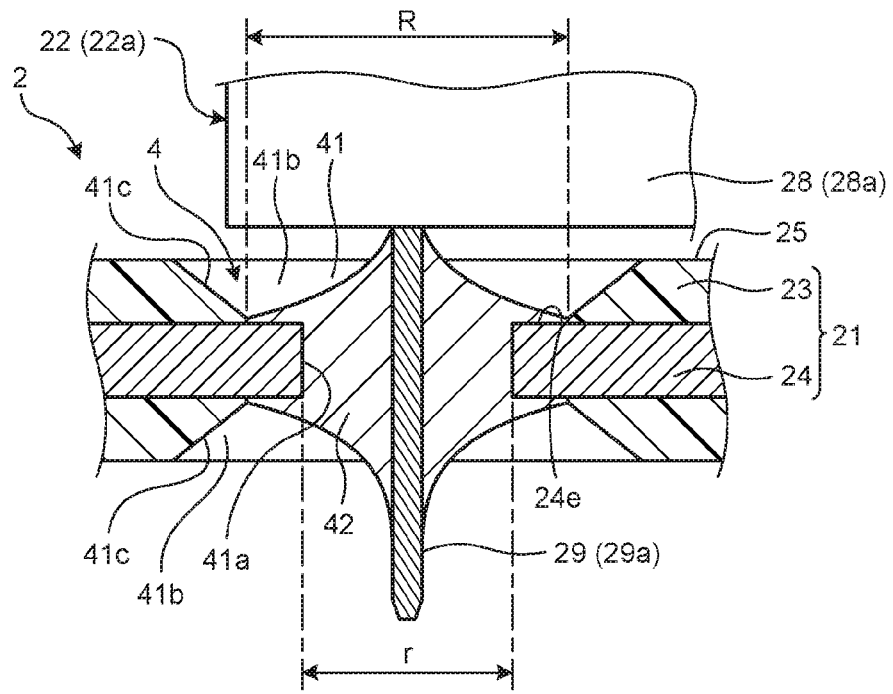
FIG. 7 is a cross-sectional view taken along the line VII-VII of FIG. 6.

FIG. 1 is a perspective view illustrating a schematic configuration of an electric connection box and a wire harness to which an electronic component unit according to the embodiment is applied. FIG. 2 is an exploded perspective view illustrating a schematic configuration of the electronic component unit according to the embodiment. FIG. 3 is a perspective view illustrating a schematic configuration of a bus bar plate of the electronic component unit according to the embodiment. FIG. 4 is a perspective view illustrating a bus bar of the electronic component unit according to the embodiment. FIG. 5 is a plan view illustrating a schematic configuration of the bus bar plate of the electronic component unit according to the embodiment. FIG. 6 is an enlarged perspective view illustrating a connection fixing unit of a relay terminal of the bus bar plate of the electronic component unit according to the embodiment. FIG. 7 is a cross-sectional view taken along the line VII-VII of FIG. 6. Further, FIG. 1 illustrates an upper cover of the electric connection box by a two-dot chain line.

As illustrated in FIG. 1, an electronic component unit 1 according to this embodiment constitutes an electronic component module that is detachably assembled to an electric connection box 100 mounted on a vehicle such as an automobile. Here, the electric connection box 100 is incorporated in a wire harness 150, and is intended to aggregate and house electric components such as a connector, a fuse, a relay, a branch and an electronic control unit that make up connection processing components such as electric wires 151 therein. The electric connection box 100, for example, is installed in an engine room of the vehicle and a lower portion of a vehicle body, and is connected between a power supply such as a battery and various electronic devices mounted inside the vehicle. The electric connection box 100 distributes the power supplied from the power supply into the various electronic devices in the vehicle. In some cases, although the electric connection box 100 is referred to as a junction box, a fuse box, a relay box or the like, in this embodiment, those are collectively referred to as an electric connection box.

In the electric connection box 100 illustrated in FIG. 1, various electronic components 102 are housed in a housing space inside a box main body 101. The box main body 101, for example, is configured to include a body 103, an upper cover 104, a lower cover 105 and the like. The box main body 101 has a three-layer division structure in which the body 103, the upper cover 104 and the lower cover 105 are divided. The body 103, the upper cover 104 and the lower cover 105 are formed of an insulating synthetic resin. The body 103 is a main member which forms a housing space in which the electronic components 102 are assembled. The body 103 is formed in a substantially square tubular shape, and in a state in which the electric connection box 100 is connected to the engine room or the like, an opening is located on a vertically upper side and a vertically lower side. The upper cover 104 is a lid-like member that closes the opening of the vertically upper side of the body 103. The lower cover 105 is a dish-like (tray-like) member that closes the opening of the vertically lower side of the body 103. In the box main body 101, the upper cover 104 is assembled to the vertically upper side of the body 103, and the lower cover 105 is assembled to the vertically lower side of the body 103 so that the opening of the vertically upper side of the body 103 faces the opening of the upper cover 104, and the opening of the vertically lower side of the body 103 faces the opening of the lower cover 105. In the box main body 101, the upper cover 104 and the lower cover 105 are locked with respect to the body 103 via various types of locking mechanisms 106. Further, although a laminating direction of the body 103, the upper cover 104 and the lower cover 105 follows a vertical direction typically in a state in which the electric connection box 100 is connected to the engine room or the like, in some cases, the laminating direction may be installed to have a predetermined angle with respect to the vertical direction depending on the installation situations of the electric connection box 100.

Further, as the various electronic components 102 assembled to the inner housing space of the box main body 101, the electronic component unit 1 of this embodiment is included, together with the connector, the fuse, the relay, the branch and the electronic control unit as described above. In the electric connection box 100, the above-described various electronic components 102 are assembled inside a plurality of cavities formed by various shapes of partition walls 107 integrally formed with the body 103, and various shapes of blocks 108 detachably assembled to the body 103. In this case, the partition wall 107, the block 108 and the like are also formed of an insulating synthetic resin, similarly to the body 103 or the like. Further, in the electric connection box 100, terminals or the like of the electric wire 151 wired via an opening 109 or the like are fitted and electrically connected to the cavity in which various electronic components 102 are assembled, from the vertically lower side.

Further, the electronic component unit 1 and a bus bar plate 2 of this embodiment are assembled to the electric connection box 100 to form a part of a power distribution circuit that distributes the power supplied from the power source of the electric connection box 100 to the various electronic devices in the vehicle. As illustrated in FIG. 2, the electronic component unit 1 is equipped with the bus bar plate 2 and a housing 3, and the bus bar plate 2 is assembled inside the housing 3.

As illustrated in FIGS. 2, 3 and 5, the bus bar plate 2 is a substrate on which electronic components 22 with metallic bus bars 24 (illustrated in FIG. 4) built-in inside a resin material 23 are mounted. The bus bar plate 2 is configured to include a substrate main body 21 and the electronic component 22.

The substrate main body 21 is configured so that the plurality of electrically conductive bus bars 24 is built in the resin material 23, in other words, the plurality of bus bars 24 is covered with the insulating resin material 23 to be insulated from each other. The substrate main body 21 is formed, for example, by insert-molding in which an insulating resin is injected around the bus bars 24 formed by a conductive metal and disposed in a metal mold to integrate the metal and resin.

A bus bar assembly 24a before molding illustrated in FIG. 4 illustrates an assembly of the bus bar 24 before the insert-molding in which the plurality of bus bars 24 is connected by a carrier 24b. The bus bar assembly 24a before molding is formed by a conductive metal, and is formed, for example, in a substantially plate shape as a whole by press-machining or the like. The bus bar assembly 24a before molding is inserted into the insert-molding metal mold in a state in which terminals 24c of each bus bar 24 are bent. The substrate main body 21 is formed by injecting an insulating resin around the bus bar assembly 24a before molding inserted to the metal mold to mold each of the bus bars 24 and the resin material 23 integrally. Further, in the substrate main body 21, the carrier 24b is cut after integrally molding each of the bus bars 24 and the resin material 23. The substrate main body 21 is formed in a rectangular plate shape as a whole. Further, in this embodiment, the thickness of the bus bar 24 is about 0.4 mm to 0.8 mm, and is preferably 0.64 mm.

As illustrated in FIGS. 3, 5 and the like, in the insert-molded substrate main body 21, the terminals 24c of the respective bus bars 24 are located at a substantially center of a short-side direction (a first width direction) side by side along a long-side direction (a second width direction perpendicular to the first width direction). Here, the terminals 24c are aligned in two rows along the long-side direction. Each terminal 24c is erected substantially perpendicularly to a mounting surface 25 that is a surface on which the electronic components 22 are mounted in the substrate main body 21. That is, the respective terminals 24c protrude and extend from the mounting surface 25 along a direction perpendicular to the short-side direction and the long-side direction. The respective terminals 24c are located between the plurality of electronic components 22 to be described later in the short-side direction. In other words, the plurality of terminals 24c is concentrated at the center of the mounting surface 25. Moreover, in the substrate main body 21, the end of the side, of each bus bar 24, connected to the carrier 24b cut after the insert-molding becomes an exposed end 24d exposed from the resin material 23 at the end surface of the substrate main body 21. That is, in the bus bar plate 2, the plurality of exposed ends 24d of the bus bar 24 is exposed at the end surface. The exposed ends 24d are formed on each of a pair of long-side end surfaces facing each other in the substrate main body 21. The plurality of exposed ends 24d is exposed side by side in the long-side direction at the end surface of each long-side.

The electronic components 22 are mounted on the mounting surface 25 of the substrate main body 21, and here, the electronic components 22 are elements which exhibit various functions. The respective terminals of the electronic components 22 are electrically connected to a predetermined bus bar 24, and the electronic components 22 are fixed on the rear surface of the mounting surface 25 by a soldering 42 or the like using a so-called lead-free solder that does not contain lead. Relays 22 (hereinafter, indicated by reference numerals 22a) and resistors 22 (hereinafter, indicated by reference numerals 22b) are used as the electronic components 22 of this embodiment. That is, the electronic component unit 1 of this embodiment is a relay unit module. In the bus bar plate 2 of this embodiment, a total of six relays 22a as the electronic components 22 are provided so that three relays each are provided side by side on both sides in the short-side direction of the respective terminals 24c along the long-side direction. In other words, in the bus bar plate 2, the relays 22a are disposed in two rows, and the plurality of terminals 24c is disposed in two rows between the relays 22a disposed in two rows. The bus bar plate 2 of the present embodiment is basically in the form of a substantially linear symmetry with respect to the center line along the long-side direction of the substrate main body 21 (the center line in the short-side direction), and the placement of the terminals 24c and the relays 22a is also a substantially linear symmetry. Further, in the bus bar plate 2, the resistors 22b as the electronic components 22 are mounted in the vicinity of the respective relays 22a. As illustrated in FIG. 6, the relays 22a include a square columnar main body 28a, and a plurality of terminals 29a protruding from the lower surface facing the mounting surface 25 of the main body 28a. As illustrated in FIG. 5, the resistor 22b has a main body 28b with an external appearance of a cylindrical shape, and a pair of terminals 29b protruding in the opposite direction from both ends in the axial direction of the main body 28b. The terminals 29a and 29b are formed in a circular cross-section, their outer diameters are 0.45 mm or more, and the terminals have dimensions capable of being attached to a through-hole 41 with the soldering 42.

The bus bar plate 2 is assembled inside the housing 3. As illustrated in FIG. 2, the housing 3 has a base cover 31, a top cover 32 and a connector fitting 33. The bus bar plate 2 is assembled to the base cover 31. The top cover 32 covers the bus bar plate 2 assembled to the base cover 31 from the opposite side of the base cover 31. A connector (not illustrated) as a connection between the terminal 24c (illustrated in FIG. 3) of the bus bar 24 of the bus bar plate 2 and the electric wire 151 is fitted to the connector fitting 33 from the lower side of FIG. 2, and the connector fitting 33 is integrally formed on the base cover 31. The base cover 31, the top cover 32 and the connector fitting 33 are formed of an insulating synthetic resin.

Specifically, as illustrated in FIG. 2, the base cover 31 is a dish-like (tray-like) member. The base cover 31 is configured to include a rectangular frame-like section 31a formed in a substantially square shape, and a bottom 31b that closes the rectangular frame-like section 31a. The bottom 31b is formed in a rectangular plate shape that is the same shape as the substrate main body 21 of the bus bar plate 2. The rectangular frame-like section 31a is formed to surround the edge of the bottom 31b. The bottom 31b is formed integrally with the rectangular frame-like section 31a in the middle of the rectangular frame-like section 31a. In the rectangular frame-like section 31a, notches 31d are formed in each of a pair of long-side wall surfaces 31c along the long-side direction of the bottom 31b, and locking claws 31e for being locked to the top cover 32 are formed. Further, in the rectangular frame-like section 31a, locking claws 31g for being locked to the box main body 101 of the electric connection box 100 are formed in each of a pair of short-side wall surfaces 31f along the short-side direction of the bottom 31b. The base cover 31 is formed in a rectangular tubular shape (partially cut by the notches 31d) in which the middle of the rectangular frame-like section 31a is closed by the bottom 31b. In the base cover 31, a space surrounded by the rectangular frame-like section 31a and the bottom 31b is divided as a housing space that houses the electronic components 22 of the bus bar plate 2.

In the base cover 31, a central wall-shaped section 31i is formed at the center of the bottom 31b. The central wall-shaped section 31i is formed so that the bottom 31b protrudes into a housing space 31h side. The central wall-shaped section 31i is formed along the long-side direction at the substantially center in the short-side direction of the bottom 31b. The central wall-shaped section 31i extends from one short-side wall surface 31f to the other short-side wall surface 31f along the long-side direction. On a leading end surface of the central wall-shaped section 31i, a plurality of terminal fitting holes 31j and a pair of screw holes 31k are formed. The terminal fitting holes 31j are holes to which the terminals 24c of the respective bus bars 24 mentioned above are fitted when the bus bar plate 2 is assembled to the base cover 31, and the terminal fitting holes corresponding in number to the respective terminals 24c are formed at the positions corresponding to the respective terminals 24c. Here, the terminal fitting holes 31j are aligned in two rows along the long-side direction. The screw holes 31k are holes to which a screws 26 for fastening the bus bar plate 2 to the base cover 31 are screwed when the bus bar plate 2 is assembled to the base cover 31.

Furthermore, in the base cover 31, the rear surface side of the central wall-shaped section 31i, that is, the opposite side of the housing space 31h has a hollow shape, and the hollow section is formed as a connector fitting 33 to which the connector serving as a connection with the electric wire 151 is fitted. The terminals 24c of the above-mentioned each bus bar 24 are exposed into the connector fitting 33 via the respective terminal fitting holes 31j in a state in which the bus bar plate 2 is assembled to the base cover 31. Here, the connector fittings 33 are formed at two locations, and a total of two connectors 4 are fitted so that each connector is fitted to each of the two connector fittings 33. That is, in the electronic component unit 1 of this embodiment, the two connectors are connected to the terminals 24c of the plurality of bus bars 24.

As illustrated in FIG. 2, the top cover 32 is a lid-like member. The top cover 32 is configured to include a rectangular frame-like section 32a formed in a substantially square shape, and a ceiling 32b that closes one opening of the rectangular frame-like section 32a. The ceiling 32b is formed in a rectangular plate shape having the same shape as the substrate main body 21 of the bus bar plate 2, and the bottom 31b of the base cover 31. The rectangular frame-like section 32a is formed so as to be erected at the edge of the ceiling 32b. In the rectangular frame-like section 32a, locking recesses 32d for being locked to the base cover 31 are formed on a pair of long-side wall surfaces 32c along the long-side direction of the ceiling 32b. Further, in the rectangular frame-like section 32a, notches 32f are formed on each of a pair of short-side wall surfaces 32e along the short-side direction of the ceiling 32b. The top cover 32 is formed in a rectangular tubular shape (partially cut by the notches 32f) in which one end is open and the other end is closed by the rectangular frame-like section 32a and the ceiling 32b.

The electronic component unit 1 configured as described above constitutes a single module by fitting the connector (not illustrated) to the connector fitting 33 in a state in which the bus bar plate 2 is assembled to the base cover 31 and the opposite side of the bus bar plate 2 to the base cover 31 is covered with the top cover 32. Further, the electronic component unit 1 constitutes a wire harness 150 wired in a vehicle such as an automobile, together with a plurality of electric wires 151 (illustrated in FIG. 1) in which the terminals and the like are attached to the connector. That is, the wire harness 150 includes the electronic component unit 1, and the plurality of electric wires 151 electrically connected to the electronic component unit 1.

More specifically, in the electronic component unit 1, in a positional relation in which the relays 22a of the bus bar plate 2 are housed in the housing space 31h of the base cover 31, that is, in a positional relation in which the mounting surface 25 (see, for example, FIG. 3) on which the relays 22a are mounted faces the bottom 31b of the base cover 31, the bus bar plate 2 is assembled to the base cover 31. In the electronic component unit 1, in a state in which the bus bar plate 2 is assembled to the base cover 31, the terminals 24c of the plurality of bus bars 24 of the bus bar plate 2 are fitted to the respective terminal fitting holes 31j of the base cover 31, and the terminals 24c are exposed to the interior of the connector fitting 33 along a direction perpendicular to the short-side direction and the long-side direction. When the electronic component unit 1 is inserted into a screw hole 27 of the bus bar plate 2 and is screwed with the screw hole 31k of the base cover 31, the bus bar plate 2 and the base cover 31 are fastened. In the electronic component unit 1, in a state in which the bus bar plate 2 is assembled to the base cover 31, three relays 22a each are located on both sides in the short-side direction of the central wall-shaped section 31i.

In the electronic component unit 1, in a positional relation in which the bus bar plate 2 assembled to the base cover 31 is covered with the top cover 32 from the opposite side of the base cover 31, the top cover 32 is mounted on the base cover 31 or the like. In the electronic component unit 1, in a state in which the top cover 32 is attached at an appropriate position, when the respective locking recesses 32d of the top cover 32 side are locked to the respective locking claws 31e of the base cover 31 side, the top cover 32 is assembled to the base cover 31. In the electronic component unit 1, in a state in which the top cover 32 is assembled to the base cover 31, the rectangular frame-like section 32a of the top cover 32 is located to overlap the outside of the rectangular frame-like section 31a of the base cover 31, and the locking claws 31g are exposed from the notches 32f of the top cover 32. Further, in the electronic component unit 1, when the connector is fitted to the connector fitting 33 along a direction perpendicular to the short-side direction and the long-side direction, the connector is connected to the terminals 24c of the plurality of bus bars 24 and is assembled at a predetermined position inside the box main body 101 of the electric connection box 100 via the respective locking claws 31g.

Further, the laminating direction of the base cover 31, the bus bar plate 2 and the top cover 32 follows the vertical direction in a state in which the electric connection box 100 is connected to the engine room or the like, similarly to the above-mentioned electric connection box 100. However, in some cases, depending on the installation situations of the electric connection box 100, the laminating direction may be installed to have a predetermined angle with respect to the vertical direction.

Incidentally, in the bus bar plate 2 of the electronic component unit 1 of this embodiment, by setting a connection fixing unit 4 among the terminals 29a of the relay 22a, the terminal 29b of the resistor 22b and the bus bar 24 to a structure illustrated in FIG. 7, an improvement in quality and easy checking of quality are achieved.

Specifically, the connection fixing unit 4 is intended to electrically connect the terminals 29a and 29b to the bus bar 24 to be fixed to the bus bar 24, that is, the substrate main body 21. As illustrated in FIG. 7, the connection fixing unit 4 is equipped with a through-hole 41 that penetrates the substrate main body 21, the terminals 29a and 29b passes inside the through-hole 41, and the terminals 29a and 29b are fixed to the bus bar 24 by soldering 42 using a lead-free solder. Since the configurations of the connection fixing unit 4 of the terminal 29a of the relay 22a and the connection fixing unit 4 of the terminal 29b of the resistor 22b are the same, hereinafter, the connection fixing unit 4 of the terminal 29a of the relay 22a will be described, and the description on the connection fixing unit 4 of the terminal 29b of the resistor 22b will not be provided. In this embodiment, since the bus bar plate 2 is provided with the plurality of relays 22a and the plurality of resistors 22b, it is desirable to set the connection fixing units 4 of all the terminals 29a and 29b thereof to have the configuration illustrated in FIG. 7. However, in the electronic component unit 1 and the bus bar plate 2, at least one connection fixing unit 4 of the terminals 29a and 29b of the plurality of relays 22a and resistors 22b may have a configuration illustrated in FIG. 7.

The connection fixing unit 4 corresponds to the terminals 29a and 29b on a one-to-one basis. As illustrated in FIG. 7, the connection fixing unit 4 includes the through-hole 41, and the solder 42 that fixes the through-hole 41 and the terminal 29a. The through-hole 41 is provided in the bus bar plate 2, and the terminal 29a of the relay 22a is soldered 42. The trough-hole 41 penetrates the resin material 23 and the bus bar 24 of the substrate main body 21, and in this embodiment, its planar shape is formed in a circular shape. The through-hole 41 is provided with a bus bar through-hole 41a that penetrates the bus bar 24, and a resin material through-hole 41b that penetrates the resin material 23 and is formed to be larger than the bus bar through-hole 41a to expose a surface 24e of the bus bar 24. The bus bar through-hole 41a and the resin material through-hole 41b are coaxial with each other. Further, in this embodiment, the bus bar through-hole 41a and the resin material through-hole 41b may have various shapes, without being limited to a circular shape.

A total of two resin material through-holes 41b are provided so that one is provided on a side closer to the mounting surface 25 than the bus bar through-hole 41a, and the other is provided on a side away from the mounting surface 25 than the bus bar through-hole 41a. Of two resin material through-holes 41b, at least a inner surface 41c of the resin material through-hole 41b closer to the mounting surface 25 than the bus bar through-hole 41a is inclined with respect to the axial direction of the through-hole 41 so that the inner diameter is gradually enlarged as it approaches the mounting surface 25. Further, the resin material through-hole 41b closer to the mounting surface 25 than the bus bar through-hole 41a is partially located and exposed on the outer side of the relay 22a than the main body 28a of the relay 22a, on the mounting surface 25. In this embodiment, in the two resin material through-holes 41b, the inner surface 41c of the resin material through-hole 41b away from the mounting surface 25 than the bus bar through-hole 41a is inclined with respect to the axial direction of the through-hole 41 so that the inner diameter is gradually enlarged as it is away from the mounting surface 25.

The inner diameter of the bus bar through-hole 41a is larger than the outer diameter of the terminal 29a. The inner diameter of the bus bar through-hole 41a is typically 1.2 mm or more and 2.0 mm or less.

A single terminal 29a passes through the inside of the through-hole 41. Since the inner diameter of the bus bar through-hole 41a is larger than the outer diameter of the terminal 29a, when the terminal 29a passes through the inside of the through-hole 41, a gap occurs between the terminal 29a and the through-hole 41. The terminal 29a passing through the inside of the through-hole 41 is freely movable inside the through-hole 41.

Also, when the inner diameter of the bus bar through-hole 41a is defined as r and the inner diameter of the resin material through-hole 41b is defined as R, the connection fixing unit 4 satisfies Formula (1) below. Further, the inner diameter R of the resin material through-hole 41b is an inner diameter of the smallest diameter position of the resin material through-hole 41b, that is, an inner diameter of a position of the resin material through-hole 41b closest to the bus bar 24. Further, the planar shapes of the bus bar through-hole 41a and the resin material through-hole 41b may not be a circular shape. Further, in particular, when the planar shape of the bus bar through-hole 41a is not a circular shape, the inner diameter r of the bus bar through-hole 41a refers to a minimum width of the width between the inner surfaces of the bus bar through-hole 41a passing through the center of the bus bar through-hole 41a in a plan view, and in particular, when the planar shape of the resin material through-hole 41b is not a circular shape, the inner diameter R of the resin material through-hole 41b refers to a minimum width of the width between the inner surfaces of the resin material through-hole 41b passing through the center of the bus bar through-hole 41a in a plan view.

$$1.5r \leq R \leq 3.25r \tag{1}$$

In this embodiment, it is desirable to satisfy Formula (2) below.

$$1.83r = R \tag{2}$$

Thus, the surface 24e of the bus bar 24 is exposed inside the through-hole 41. For example, when the inner diameter r of the bus bar through-hole 41a is 1.2 mm, the inner diameter R of the resin material through-hole 41b is 1.8 mm or more and 3.9 mm or less, and when satisfying Formula (2), the inner diameter R of the resin material through-hole 41b is 2.2 mm. As a result, the radial width around the terminal 29a of the surface 24e of the bus bar 24 exposed inside the through-hole 41 is 0.3 mm or more and 1.35 mm or less. When satisfying Formula (2), the radial width around the terminal 29a of the surface 24e of the bus bar 24 exposed inside the through-hole 41 is 0.5 mm. Further, in this embodiment, it is desirable that both of the two resin material through-holes 41b satisfy Formula (1) and satisfy the Formula (2). However, at least one of the two resin material through-holes 41b may satisfy Formula (1) and preferably may satisfy Formula (2).

The through-hole 41 of the connection fixing unit 4 of the above-mentioned configuration is obtained by forming the bus bar through-hole 41a penetrating the bus bar 24 when pressing the conductive metal forming the bus bar assembly 24a before molding, and by forming the resin material through-hole 41b penetrating the resin material 23 when insert-molding the substrate main body 21.

The solder 42 is formed of a so-called lead-free solder, and after a predetermined mass is located in the through-hole 41 through which the terminal 29a passes, the solder is melted once in a reflow furnace and is solidified, thereby fixing the terminal 29a to the bus bar 24 in the through-hole 41. Further, the solder 42 is formed in a conical shape (a mountain shape) that sets the terminal 29a as an apex by surface tension or the like when once melted.

As it will be described below, the connection fixing unit 4 having the above-described configuration fixes the terminals 29a and 29b of the relay 22a and the resistor 22b to the substrate main body 21. First, the mounting surface 25 of the bus bar plate 2 faces upward, and the mounting surface 25 is parallel to the horizontal direction. The terminals 29a and 29b pass through the through-hole 41 of the connection fixing unit 4, and the main bodies 28a and 28b are placed on the mounting surface 25. Further, in the relay 22a and the resistor 22b, the terminals 29a and 29b located on the back side of the mounting surface 25 are fixed to the bus bar 24 or the like by the reflow soldering 42 or the like. Thus, the connection fixing unit 4 fixes the terminals 29a and 29b of the relay 22a and the resistor 22b to the substrate main body 21.

According to the electronic component unit 1 as described above, it includes the bus bar plate 2 in which the metallic bus bar 24 is built in the resin material 23 and the relay 22a and the resistor 22b are mounted, and the housing 3 in which the bus bar plate 2 is internally assembled. In the bus bar plate 2, the through-hole 41 of the connection fixing unit 4, which fixes the terminals 29a and 29b of the relay 22a and the resistor 22b by the soldering 42, satisfies the above Formula (1).

Therefore, in the electronic component unit 1 and the bus bar plate 2, the inner diameter R of the resin material through-hole 41b of the through-hole 41 is set to 1.5 times or more the inner diameter r of the bus bar through-hole 41a. Thus, in the electronic component unit 1 and the bus bar plate 2, the surface 24e of the bus bar 24 having a sufficient area is exposed in the through-hole 41. For example, when the inner diameter r of the bus bar through-hole 41a is 1.2 mm, the width of the exposed surface 24e of the bus bar 24 in the through-hole 41 is 0.3 mm or more. As a result, in the electronic component unit 1 and the bus bar plate 2, when soldering 42 the terminals 29a and 29b of the relay 22a and the resistor 22b using the lead-free solder, it is possible to regulate contact of the solder 42 once melted to the resin material 23. Thus, in the electronic component unit 1 and the bus bar plate 2, when soldering 42 the terminals 29a and 29b of the relay 22a and the resistor 22b, the solder 42 once melted does not melt the resin material 23, and it is possible to suppress an occurrence of air bubbles (voids and pinholes) caused by the gas generated by melting of the resin material 23 in the solder 42 after solidification. Thus, in the electronic component unit 1 and the bus bar plate 2, since air bubbles do not generate in the solder 42, it is possible to bring the solder 42 into close contact with the surface 24e of the bus bar 24, and it is possible to fix the terminals 29a and 29b of the relay 22a and the resistor 22b to the substrate main body 21 so that the solder 42 is not peeled off from the surface 24e of the bus bar 24. Thus, the electronic component unit 1 and the bus bar plate 2 exhibit an effect that is capable of improving the quality on mounting the relay 22a and the resistor 22b.

Further, in the electronic component unit 1 and the bus bar plate 2, the inner diameter R of the resin material through-hole 41b of the through-hole 41 is set to 3.25 times or less the inner diameter r of the bus bar through-hole 41a. Thus, for example, when the inner diameter r of the bus bar through-hole 41a is 1.2 mm, the width of the exposed surface 24e of the bus bar 24 in the through-hole 41 is 1.35 mm or less. As a result, the electronic component unit 1 and the bus bar plate 2 can suppress an increase in an area of the exposed surface 24e of the bus bar plate 2, in addition to that it is possible to prevent the solder 42 once melted from melting the resin material 23 by coming into contact therewith. Thus, the electronic component unit 1 and the bus bar plate 2 exhibit an effect that is capable of sufficiently ensuring a creepage distance (an insulation distance) between the surfaces 24e of the bus bar 24 to which the terminals 29a and 29b are fixed, and in particular, capable of suppressing an occurrence of a leakage current at the time of dew condensation or high-temperature and high-humidity.

Furthermore, in the electronic component unit 1 and the bus bar plate 2, when the through-hole 41 satisfies Formula (2) and the inner diameter r of the bus bar through-hole 41a is 1.2 mm, the width of the exposed surface 24e of the bus bar 24 in the through-holes 41 is 0.5 mm. In this case, the electronic component unit 1 and the bus bar plate 2 can suppress an increase in an area of the exposed surface 24e of the bus bar plate 2, in addition to that it is possible to suppress the solder 42 once melted from melting the resin material 23 by coming into contact therewith. Thus, the electronic component unit 1 and the bus bar plate 2 exhibit effects capable of improving the quality on mounting the relay 22a and the resistor 22b, and in particular, capable of suppressing an occurrence of the leakage current at the time of dew condensation or high-temperature and high-humidity.

Further, in the electronic component unit 1 and the bus bar plate 2 described above, the inner diameter of at least the resin material through-hole 41b of the through-hole 41 closer to the mounting surface 25 is gradually enlarged as it approaches the mounting surface 25. Furthermore, in the electronic component unit 1 and the bus bar plate 2, at least a part of the resin material through-hole 41b of the through-hole 41 closer to the mounting surface 25 is disposed on the outer side of the relay 22a than the main body 28a of the relay 22a in the mounting surface 25. Thus, in the electronic component unit 1 and the bus bar plate 2, a worker can visually check the solder 42 in the through-hole 41 and can easily grasp the situation of the solder 42. Thus, the electronic component unit 1 and the bus bar plate 2 exhibit an effect capable of easily grasping the fixed situation of the relay 22a and the resistor 22b to the substrate main body 21, that is, capable of easily checking the quality.

Since the wire harness 150 as described above is provided with the electronic component unit 1 and the bus bar plate 2, it exhibits an effect capable of improving the quality on mounting the relay 22a and the resistor 22b, and easily checking the quality.

Modified Example

Figure 8:
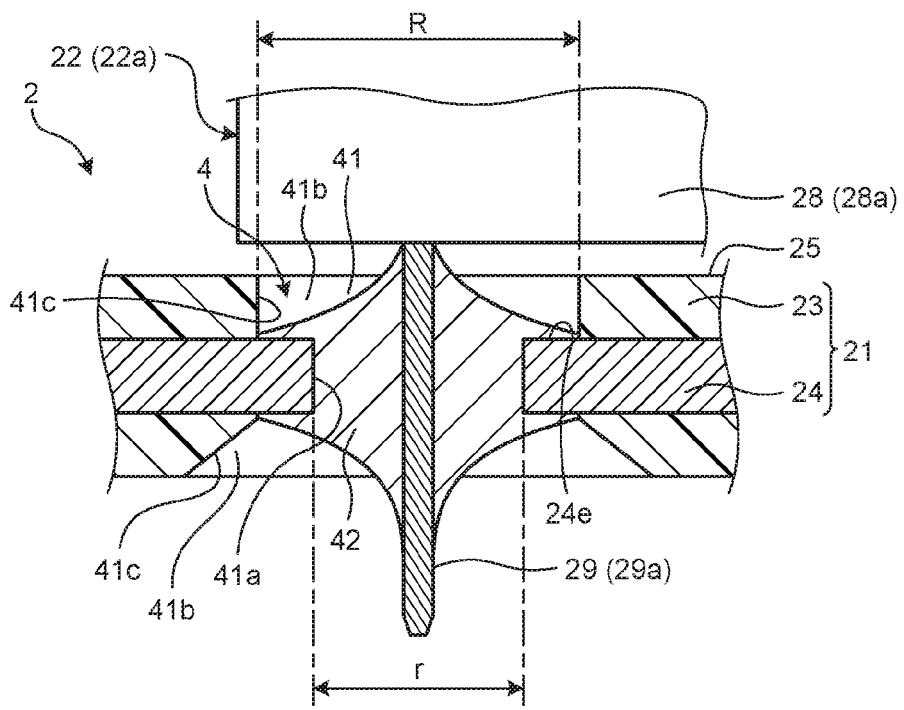
FIG. 8 is a cross-sectional view of a connection fixing unit of the bus bar plate of the electronic component unit according to a modified example of the embodiment.

Next, the bus bar plate 2 according to a modified example of the embodiment will be described with reference to FIG. 8. FIG. 8 is a cross-sectional view of a connection fixing unit of the bus bar plate of the electronic component unit according to a modified example of the embodiment. In FIG. 8, the same parts as in the embodiment are denoted by the same reference numerals, and the description thereof will not be provided.

In the bus bar plate 2 of the electronic component unit 1 according to the modified example of the embodiment, in the two resin material through-holes 41b of connection fixing unit 4, an inner diameter of the resin material through-hole 41b closer to the mounting surface 25 than the bus bar through-hole 41a is constantly formed in the axial direction thereof. In the bus bar plate 2 of the electronic component unit 1 according to the modified example, the through-hole 41 preferably satisfies Formula (1) and satisfies Formula (2).

With the electronic component unit 1, the bus bar plate 2 and the wire harness 150 according to the modified example, similarly to the embodiment, there is an effect capable of improving the quality on mounting the relay 22a and the resistor 22b, and easily checking the quality.

Next, the inventors of the present invention have confirmed the effects of the present invention by actually producing the comparative example and the example corresponding to the above-described embodiment. The results are illustrated in FIGS. 9 and 10. FIG. 9 illustrates an occurrence situation of voids of the example and the comparative example. FIG. 10 is a diagram illustrating the occurrence situation of a leakage current of the example and the comparative example.

In Comparative Examples 1 and 2 and Examples 1 to 3 illustrated in FIGS. 9 and 10, the inner diameter r of the bus bar through-hole 41a is 1.2 mm, and the thickness of the bus bar 24 is 0.64 mm. In Comparative Example 1, R/r is 1.1, and in Comparative Example 2, R/r is 3.5. In Example 1, R/r is 1.5, and the radial width around the terminal 29a of the surface 24e of the bus bar 24 exposed inside the through-hole 41 is 0.3 mm. In Example 2, R/r is 1.83, and the radial width around the terminal 29a of the surface 24e of the bus bar 24 exposed inside the through-hole 41 is 0.5 mm. In Example 3, R/r is 3.25, and the radial width around the terminal 29a of the surface 24e of the bus bar 24 exposed inside the through-hole 41 is 1.35 mm.

According to FIGS. 9 and 10, in Comparative Example 1, a void was generated in the solder 42, and in Comparative Example 2, the leakage current was generated between the surfaces 24e of the bus bar 24 to which the terminals 29a and 29b are fixed. In contrast, in Examples 1 to 3, a void was not generated in the solder 42, and the leakage current was not generated between the surfaces 24e of the bus bar 24 to which the terminals 29a and 29b are fixed.

As a result, according to FIGS. 9 and 10, it has been found that it is possible to improve the quality at the time of mounting of the electronic components 22 such as the relay 22a and the resistor 22b by satisfying 1.5r≤R. Moreover, it has been found that it is possible to suppress an occurrence of the leakage current by satisfying R≤3.25. Preferably, it has been found that it is possible to improve the quality at the time of mounting the electronic component 22 and to suppress an occurrence of the leakage current by satisfying 1.83r=R.

Further, the bus bar plate 2, the electronic component unit 1, the electric connection box 100 and the wire harness 150 according to the embodiment of the present invention described above can be changed in various ways within the scope of claims, without being limited to the embodiment described above.

Although the electronic component unit 1 described above has been described as the one which forms the electronic component module that is detachably assembled to the electric connection box 100, it is not limited thereto. The configuration of the electronic component unit of this embodiment, for example, may be applied to the electric connection box 100 itself.

Although the electronic components 22 described above have been described as the relay 22a and the resistor 22b, those are not limited thereto, and may be various electronic components, such as fuses or aluminum electrolytic capacitors.

Although the thickness of the bus bar 24 was 0.64 mm in Examples 1 to 3, it is not limited thereto. In this case, the constant (a ratio of the inner diameter) of Formula (1) and Formula (2) may be multiplied by a predetermined coefficient depending on the thickness of the bus bar 24. In this case, typically, the coefficient may be set so that, as the bus bar 24 becomes thicker, the width (also referred to as a land width) of the surface 24e of the bus bar 24 exposed in the resin material through-hole 41b becomes narrower, and as the thickness of the bus bar 24 becomes thinner, the land width becomes wider.

In the bus bar plate according to the present invention, the inner diameter of the resin material through-hole of the through-hole is set to 1.5 times or more the inner diameter of the bus bar through-hole. Thus, in the bus bar plate, the surface having a sufficient area of the bus bar in the through-hole is exposed. As a result, the bus bar plate can fix the terminal of the electronic component so that the solder is not peeled off from the surface of the bus bar plate. Thus, the bus bar plate exhibits an effect that is capable of improving the quality at the time of mounting the electronic component.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A bus bar plate comprising:
   a metallic bus bar that is built in a resin material and includes a through-hole in which terminals of an electronic component mounted on a mounting surface are soldered, wherein
   the through-hole is provided with:
   a bus bar through-hole which penetrates the metallic bus bar; and
   a resin material through-hole which penetrates the resin material and is larger than the bus bar through-hole to expose the surface of the metallic bus bar;
   when an inner diameter of the bus bar through-hole is defined as r and an innermost diameter of the resin material through-hole is defined as R, $1.5r \leq R \leq 3.25r$ and $1.2 \text{ mm} \leq r \leq 2.0 \text{ mm}$ are satisfied, and
   a thickness of the metallic bus bar is 0.4 mm to 0.8 mm.

2. The bus bar plate according to claim 1, wherein
   when the inner diameter of the bus bar through-hole is defined as r and the innermost diameter of the resin material through-hole is defined as R, $1.83r=R$ is satisfied.

3. The bus bar plate according to claim 1, wherein
   the resin material through-hole is tapered so as to be gradually enlarged as the resin material through-hole approaches the mounting surface.

4. The bus bar plate according to claim 2, wherein
   the resin material through-hole is tapered so as to be gradually enlarged as the resin material through-hole approaches the mounting surface.

5. An electronic component unit comprising:
   a bus bar plate provided with a metallic bus bar that is built in a resin material and includes a through-hole in which terminals of an electronic component mounted on a mounting surface are soldered; and
   a housing in which the bus bar plate is internally assembled, wherein
   the through-hole is provided with:
   a bus bar through-hole which penetrates the metallic bus bar; and
   a resin material through-hole which penetrates the resin material and is larger than the bus bar through-hole to expose the surface of the metallic bus bar, when an inner diameter of the bus bar through-hole is defined as r and an innermost diameter of the resin material through-hole is defined as R, $1.5r \leq R \leq 3.25r$ and $1.2 \text{ mm} \leq r \leq 2.0 \text{ mm}$ are satisfied, and a thickness of the metallic bus bar is 0.4 mm to 0.8 mm.

6. A wire harness comprising:

an electronic component unit equipped with a bus bar plate provided with a metallic bus bar that is built in a resin material and includes a through-hole in which terminals of an electronic component mounted on a mounting surface are soldered, and a housing in which the bus bar plate is internally assembled; and an electric wire electrically connected to the electronic component unit, wherein the through-hole is provided with:
- a bus bar through-hole which penetrates the metallic bus bar; and
- a resin material through-hole which penetrates the resin material and is larger than the bus bar through-hole to expose the surface of the metallic bus bar, and when an inner diameter of the bus bar through-hole is defined as r and an innermost diameter of the resin material through-hole is defined as R, $1.5r \leq R \leq 3.25r$ and $1.2 \text{ mm} \leq r \leq 2.0 \text{ mm}$ are satisfied, and a thickness of the metallic bus bar is 0.4 mm to 0.8 mm.

7. The bus bar plate according to claim 1, wherein when the inner diameter of the bus bar through-hole is defined as r, r=1.2 mm is satisfied, and a radial width around the terminal of the surface of the bus bar exposed inside the through-hole is 0.3 mm or more and 1.35 mm or less.

\* \* \* \* \*